US011189345B2

(12) United States Patent
Liu et al.

(10) Patent No.: US 11,189,345 B2
(45) Date of Patent: Nov. 30, 2021

(54) METHOD FOR IMPLEMENTING LOGIC CALCULATION BASED ON A CROSSBAR ARRAY STRUCTURE OF RESISTIVE SWITCHING DEVICE

(71) Applicant: INSTITUTE OF MICROELECTRONICS CHINESE ACADEMY OF SCIENCES, Beijing (CN)

(72) Inventors: Qi Liu, Beijing (CN); Wei Wang, Beijing (CN); Sen Liu, Beijing (CN); Feng Zhang, Beijing (CN); Hangbing Lv, Beijing (CN); Shibing Long, Beijing (CN); Ming Liu, Beijing (CN)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 16/959,225

(22) PCT Filed: Jan. 22, 2018

(86) PCT No.: PCT/CN2018/073641
§ 371 (c)(1),
(2) Date: Jun. 30, 2020

(87) PCT Pub. No.: WO2019/140693
PCT Pub. Date: Jul. 25, 2019

(65) Prior Publication Data
US 2020/0335165 A1 Oct. 22, 2020

(51) Int. Cl.
G11C 13/00 (2006.01)
H03K 19/20 (2006.01)

(52) U.S. Cl.
CPC ......... *G11C 13/0069* (2013.01); *H03K 19/20* (2013.01)

(58) Field of Classification Search
CPC ................ H03K 19/20; G11C 13/0069; G11C 13/0002; G11C 13/0009
See application file for complete search history.

(56) References Cited

U.S. PATENT DOCUMENTS

2015/0256178 A1* 9/2015 Kvatinsky ............ H03K 19/177
326/31
2017/0287558 A1* 10/2017 Liu .................... G11C 13/0069
(Continued)

FOREIGN PATENT DOCUMENTS

CN 104898990 9/2015
CN 105675024 6/2016
(Continued)

OTHER PUBLICATIONS

International Search Report and Written Opinion issued in PCT/CN2018/073641, dated Oct. 19, 2018.

*Primary Examiner* — Anh Q Tran
(74) *Attorney, Agent, or Firm* — Pillsbury Wnthrop Shaw Pittman LLP

(57) ABSTRACT

An operation method for integrating logic calculations and data storage based on a crossbar array structure of resistive switching devices. The calculation and storage functions of the method are based on the same hardware architecture, and the data storage is completed while performing calculation, thereby realizing the fusion of calculation and storage. The method includes applying a pulse sequence to a specified word line or bit line by a controller, configuring basic units of resistive switching devices to form different serial-parallel structures, such that three basic logic operations, i.e. NAND, OR, and COPY, are implemented and mutually combined on this basis, thereby implementing 16 types of (Continued)

binary Boolean logic and full addition operations, and on this basis, a method for implementing a parallel logic and full addition operations is provided.

15 Claims, 4 Drawing Sheets

(56) References Cited

U.S. PATENT DOCUMENTS

2018/0321942 A1\* 11/2018 Yu .................. G11C 13/003
2018/0367149 A1\* 12/2018 Kvatinsky .......... G11C 13/0069

FOREIGN PATENT DOCUMENTS

| CN | 106128503 | 11/2016 |
| CN | 106297876 | 1/2017 |
| CN | 106847335 | 6/2017 |
| WO | 2014109771 | 7/2014 |

\* cited by examiner

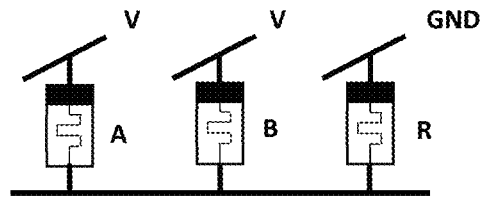
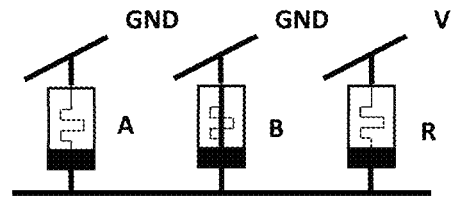
FIG. 4A FIG. 4B
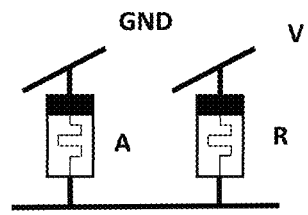
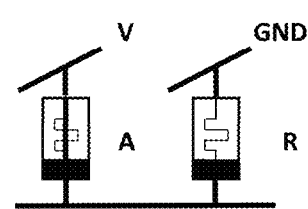
FIG. 5A FIG. 5B
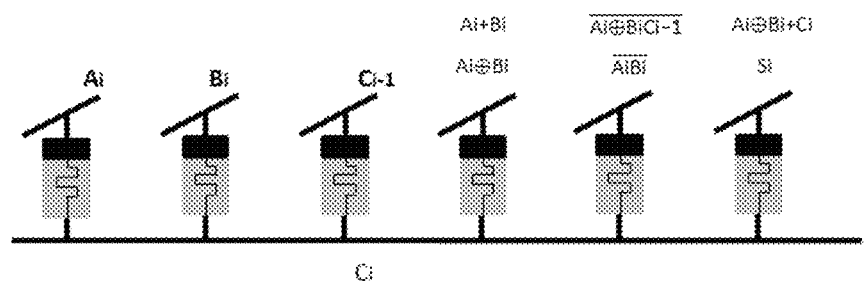
FIG. 6
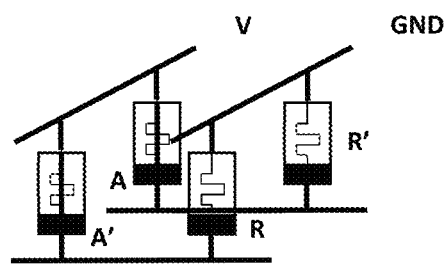
FIG. 7

| Name of the Logic | TRUE | FALSE | A | B | NOT A | NOT B | OR | NAND |
|---|---|---|---|---|---|---|---|---|
| Operation steps | Setting operation | Reset operation | | | | | | |
| Functions implemented and number of steps | 1<br>1 step | 0<br>1 step | A<br>1 step | B<br>1 step | $\bar{A}$<br>1 step | $\bar{B}$<br>1 step | A+B<br>1 step | $\overline{AB}$<br>1 step |

| Name of the Logic | AND | IMP | NIMP | RNIMP | RIMP | NOR | NXOR | XOR |
|---|---|---|---|---|---|---|---|---|
| Operation steps | | | | | | | | |
| Functions and steps | $AB$ $=\overline{\overline{AB}}$ 2 steps | $\overline{A}+B$ 2 steps | $A\overline{B}$ 1 step | $\overline{A}B$ 1 step | $\overline{B}+A$ 2 steps | $\overline{A+B}$ 2 steps | $\overline{A+B}+$ $\overline{AB}$ = $\overline{(A+B)(\overline{AB})}$ 3 steps | $A\overline{B}+\overline{A}B$ = $(A+B)(\overline{AB})$ 2 steps |

FIG. 10

METHOD FOR IMPLEMENTING LOGIC CALCULATION BASED ON A CROSSBAR ARRAY STRUCTURE OF RESISTIVE SWITCHING DEVICE

This application is the U.S. national phase entry of PCT Patent Application No. PCT/CN2018/073641, filed on Jan. 22, 2018.

TECHNICAL FIELD

The present disclosure belongs to the field of microelectronic technology, and particularly relates to a method for the fusion of computing and storage based on a crossbar array structure of resistive switching devices.

BACKGROUND

Traditional computing systems use the Von Neumann architecture in which the memory and the computing unit are separated in space. Frequent data exchange between them consumes a lot of energy and time, and it is extremely inefficient to process large amounts of information. Therefore, the development of new information devices and technologies that integrate logical calculations and data storage has become a research hotspot in the field of microelectronics. Non-volatile resistive memory has the advantages of small size, low power consumption, and easy large-scale integration. It is expected to break the bottleneck of the Von Neumann architecture and implement a new energy efficient computing system with the fusion of calculations and storage.

At present, logic operations based on resistive switching devices require a large number of calculation units when implementing complex logic functions, and the operation steps are complex, which does not meet the needs of practical applications.

SUMMARY

In view of this, an object of the present disclosure is to provide a method for realizing logic calculation based on a crossbar array structure of resistive switching devices to solve at least part of the technical problems described above.

(2) Technical Solution

An embodiment of the present disclosure provides a method for implementing logic calculation based on a crossbar array structure of resistive switching devices, comprising the steps of:

selecting two or three resistive switching units sharing a word line or bit line;

using one of the resistive switching units as an output resistive switching unit, and using the remaining resistive switching units as input resistive switching units;

The terminal of the word line or bit line at which all the resistive switching units shared should remain float. The terminal of the output resistive switching unit should be connected to a high or low voltage. The terminal of the input resistive switching units should be connected to a voltage level opposite to the output resistive switching unit. The logic operation results are stored in the output resistive switching unit.

In a further technical solution, the input resistive switching units comprise a first input resistive switching unit and a second input resistive switching unit, and the output resistive switching unit is initially set to "1", the first input resistive switching unit, the second input resistive switching unit and the output resistive switching unit share a word line or bit line at a terminal, and no level is applied to the word line or bit line; the other terminal of each of the first input resistive switching unit and the second input resistive switching unit is connected to a high or low level, the other terminal of the output resistive switching unit is connected to a level opposite to the other terminal of each of the first input resistive switching unit and the second input resistive switching unit, and a current direction of the output resistive switching unit is ensured to be negative to implement a NAND logic, that is, if data stored in the first input resistance switching unit is A and data stored in the second input resistance switching unit is B, then data stored in the output resistive switching unit after implementing the NAND logic is R=$\overline{AB}$.

In a further technical solution, the input resistive switching units comprise a first input resistive switching unit, the output resistive switching unit is initially set to "0", the first input resistive switching unit and the output resistive switching unit share a word line or bit line at a terminal, and no level is applied to the word line or bit line; the other terminal of the first input resistive switching unit is connected to a high or low level, the other terminal of the output resistive switching unit is connected to a level opposite to the other terminal of the first input resistive switching unit, and a current direction of the output resistive switching unit is guaranteed to be positive to implement a COPY logic, that is, if data stored in the first input resistive switching unit is A, then data stored in the output resistive switching unit is R=A after implementing the COPY logic.

In a further technical solution, the input resistive switching units comprise a first input resistive switching unit and a second input resistive switching unit. Data stored in the first input resistive switching unit and the second input resistive switching unit are denoted as "A" and "B", respectively, and a result stored in the output resistive switching unit is denoted as "R", the output resistive switching unit has a positive terminal grounded and a negative terminal connected to a voltage bias, and is initialized to "0" in advance. The positive or negative terminals of the first input resistive switching unit, the second input resistive switching unit and the output resistive switching unit are connected together. When the positive terminals of the first input resistive switching unit, the second input resistive switching unit and the output resistive switching unit are connected together, the negative terminals of the first input resistive switching unit and the second input resistive switching unit are connected to a voltage bias, and the negative terminal of the output resistive switching unit is grounded. When the negative terminals of the first input resistive switching unit, the second input resistive switching unit and the output resistive switching unit are connected together, the positive terminals of the first input resistive switching unit and the second input resistive switching unit are grounded, and the positive terminal of the output resistive switching unit is connected to a voltage bias. A pulse is applied to ensure that a current direction of the output resistive switching unit is positive to implement an OR operation, and a result of the operation, which is expressed as R=A+B, is stored in the output resistive switching unit.

In a further technical solution, data stored in the first input resistive switching unit and the second input resistive switching unit are denoted as "A" and "B", respectively, and the first input resistive switching unit and the second input resistive switching unit are connected to a same word line or bit line. The initial data stored in the output resistive switching unit connected to the word line or bit line is denoted as "C". There are two cases of the three resistive switching units connected to the same bit line or word line. That is, the positive terminals are connected together or the negative terminals are connected together. If the positive terminals are connected together, a voltage $V_{OR}$ is applied, through a word line or a bit line, to two terminals of the first input resistive switching unit and the second input resistive switching unit that are not connected. The other terminal of the output resistive switching unit, which is not connected to the first input resistive switching unit and the second input resistive switching unit, is grounded. If the negative terminals are connected together and connected to the voltage $V_{OR}$ are performed in an opposite way; a final result is stored in the output resistive switching unit, and a resistance value R of the output resistive switching unit is a result of an OR operation of A, B and C, and is expressed as R=A+B+C.

In a further technical solution, the input resistive switching units comprise a first input resistive switching unit and a second input resistive switching unit, data stored in the first input resistive switching unit and the second input resistive switching unit are denoted as "A" and "B", respectively, and the first input resistive switching unit and the second input resistive switching unit are connected to a same word line or bit line, and initial data stored in the output resistive switching unit connected to the word line or bit line is denoted as "C", there are two cases of the three resistive switching units connected to the same bit line or word line, that is, the positive terminals are connected together or the negative terminals are connected together, if the positive terminals are connected together, two terminals of the first input resistive switching unit and the second input resistive switching unit that are not connected are grounded through a word line or a bit line, and a voltage $V_{NAND}$ is applied to the other terminal of the output resistive switching unit, which is not connected to the first input resistive switching unit and the second input resistive switching unit, if the negative terminals are connected together, connecting to the voltage $V_{NAND}$ and grounding are performed in an opposite way; a final result is stored in the output resistive switching unit, and a resistance value R of the output resistive switching unit results from an "AND" operation of C and a result of an "NAND" operation of A and B, which is expressed as R=$\overline{AB}$C.

In a further technical solution, the first input resistive switching unit and the output resistive switching unit are connected to a same word line or bit line, data stored in the first input resistive switching unit is "A", and initial data stored in the output resistive switching unit connected to the word line or bit line is "C", there are two cases of the two resistive switching units connected to the same bit line or word line, that is, the positive terminals are connected together or the negative terminals are connected together, if the positive terminals are connected together, a voltage $V_{COPY}$ is applied, through a word line or a bit line, to the other terminal of the first input resistive switching unit that is not interconnected, and the other terminal of the output resistive switching unit, which is not connected to the first input resistive switching unit, is grounded, if the negative terminals are connected together, connecting to the voltage $V_{COPY}$ and grounding are performed in an opposite way; a final result is stored in the output resistive switching unit, and a resistance value R of the output resistive switching unit is a result of an OR operation of A and C, and is expressed as R=A+C.

The present disclosure provides a method for implementing logic calculation based on a crossbar array structure of resistive switching devices. By combining or reconstructing at least two or more of the above logic calculation methods, 16 types of binary Boolean logic operations are implemented.

(3) Beneficial Effects

Through the above method, the problems of the existing logic calculation based on the resistive switching device (that is, a large number of resistive switching units are required, and the operation steps are complicated and verbose) are solved. The present disclosure proposes a method for realizing the integration of calculation and storage based on the crossbar array structure of resistive switching devices. By designing the positions where pulse sequences are applied in the cross lattice, the resistive switching units form different serial-parallel structures.

BRIEF DESCRIPTION OF THE DRAWINGS

FIGS. 4A and 4B are schematic diagrams of two operation modes of the NAND logic according to an embodiment of the present disclosure.

FIGS. 5A and 5B are schematic diagrams of two operation modes of the COPY logic according to an embodiment of the present disclosure.

FIG. 6 is a schematic diagram of the operations of implementing the one-bit full adder according to an embodiment of the present disclosure.

FIG. 7 is a schematic diagram of the parallel operations for implementing COPY according to an embodiment of the present disclosure.

FIG. 10 is a schematic diagram of the combinations of other eight types of Boolean operations according to an embodiment of the present disclosure.

DETAILED DESCRIPTION

Figure 1:
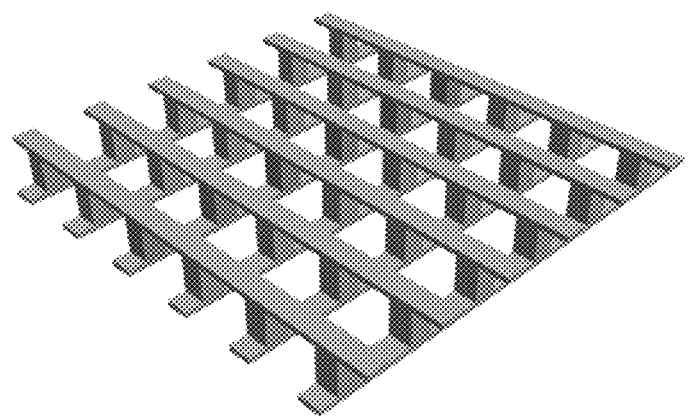
FIG. 1 is a schematic diagram of a cross-point memory array according to an embodiment of the disclosure.

Hereinafter, some examples will be provided to explain the embodiments of the present disclosure in detail. The advantages and effects of the present disclosure will become more apparent from the following description of the present disclosure. The attached drawings are simplified and used for illustration. The number, shape and size of the components shown in the drawings may be modified according to the actual situation, and the configuration of the components may be more complicated. The present disclosure may also be practiced or applied in other aspects, and various changes and adjustments may be made without departing from the spirit and scope defined by the present disclosure.

The novel calculation-storage integration method based on the crossbar array structure of resistive switching units comprises applying a pulse sequence to basic units of a word line or bit line by a controller, configuring basic units of resistive switching devices to form different serial-parallel structures, such that three basic logic operations, i.e. NAND, OR, and COPY, are implemented and mutually combined on this basis, thereby implementing all binary Boolean logic operations.

FIG. 1 is a schematic diagram of a cross-point memory array. The logical calculation operation method of the present disclosure does not need to change its structure, and also does not change the original data reading and writing method. Therefore, the reading and setting mode of the basic resistive switching units and the read-write circuits at the periphery are not described herein in detail.

According to the embodiment of the present disclosure, depending on the needs of different logical calculations, the resistive switching units and the result storage unit on the same word line or bit line that need to participate in the calculation are applied with corresponding pulses for operation, and the operation results are directly stored in the result storage unit, so that they may be used for the next operation or output. The different types of operations are determined by the way in which pulses are applied. By applying pulses in different ways, different series-parallel structures of the resistive switching units are formed to complete the corresponding logical calculation functions. All resistive switching units in the array may participate in the operation or store the operation result. The calculation and storage are completed at the same time, which saves data transmission time, without making any changes to the storage structure and read-write circuit of the cross point array. Integration of calculation and storage in process and architecture are realized. The implemented operation functions cover 16 types of Boolean logic, and further combinations may implement complex operations such as addition and multiplication, which will be described in detail below.

Figure 2A:
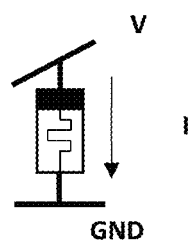
FIGS. 2A and 2B are schematic diagrams of SET and RESET process of a resistive switching device according to an embodiment of the present disclosure, respectively.
Figure 2B:
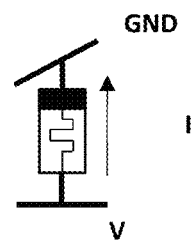

FIGS. 2A and 2B are schematic diagrams of setting and resetting a resistive switching device according to an embodiment of the present disclosure, respectively. The resistive switching device in the high resistance state corresponds to the logic "0", and the resistive switching device in the low resistance state corresponds to the logic "1". As shown in FIG. 2A, the process of the device changing from "0" to "1" is the setting process. In this process, the positive terminal of the device is connected to voltage V, the negative terminal of the device is grounded, and the current flows from the positive terminal to the negative terminal. The device changes from a high resistance state to a low resistance state. As shown in FIG. 2B, the process of the device changing from "1" to "0" is the resetting process. In this process, the positive terminal of the device is grounded, the negative terminal of the device is connected to voltage V, and the current flows from the negative terminal to the positive terminal. The device changes from a low resistance state to a high resistance state.

OR Logic Operation

Figure 3A:
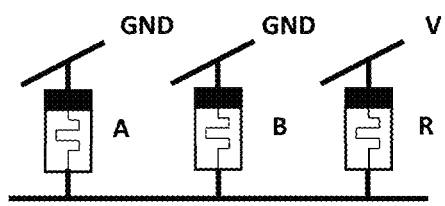
FIGS. 3A and 3B are schematic diagrams of two operation modes of the OR logic according to an embodiment of the present disclosure.
Figure 3B:
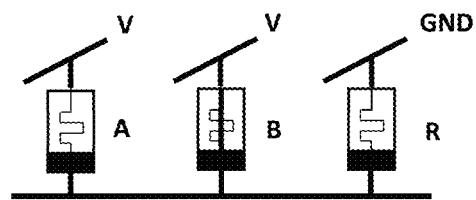

FIGS. 3A and 3B illustrate a method for implementing an OR logic operation according to an embodiment of the present disclosure. As shown in FIGS. 3A and 3B, the information stored in the first input resistive switching device, the second input resistive switching device, and the result storage device are A, B, and R, respectively. For convenience, these three devices are referred to hereinafter as A, B, and R. There are two cases for the three resistive switching units connected to the same bit line or word line as shown in the figure, that is, the positive terminals are connected together or the negative terminals are connected together. First, the result storage device R is set to "0". A pulse is applied to ensure that the current direction of R is positive. That is, when the negative terminals of A, B and R are connected (see FIG. 3A), the positive terminals of A and B are grounded, and the positive terminal of R is connected to voltage V; when the positive terminals of A, B and R are connected (see FIG. 3B), the positive terminals of A and B are grounded, and the positive terminal of R is connected to voltage V. In this way, the result of the OR logic operation of A and B is obtained in the resistive switching unit R, which is expressed as R=A+B.

Multi-Input Logic Operation R'=A+B+R

FIGS. 3A and 3B illustrate a method for implementing an OR logic operation according to an embodiment of the present disclosure. As shown in FIGS. 3A and 3B, the information stored in the first input resistive switching device, the second input resistive switching device, and the result storage device are A, B, and R, respectively. There are two cases of the three resistive switching units connected to the same bit line or word line as shown in the figure, that is, the positive terminals are connected together or the negative terminals are connected together. A pulse is applied to ensure that the current direction of R is positive. That is, when the negative terminals of A, B and R are connected, the positive terminals of A and B are grounded, and the positive terminal of R is connected to voltage V; when the positive terminals of A, B and R are connected, the positive terminals of A and B are grounded, and the positive terminal of R is connected to voltage V. In this way, the result R' of the OR logic operation of A, B, and R is obtained in the resistive switching unit R, which is expressed as R'=A+B+R. The initial information stored in the resistive switching unit R is overwritten.

NAND Logic Operation

FIGS. 4A and 4B illustrate a method for implementing a NAND logic operation according to an embodiment of the disclosure. The information stored in the first input resistive switching device, the second input resistive switching device, and the result storage device are A, B, and R, respectively. There are two cases of the three resistive switching units connected to the same bit line or word line as shown in the figure, that is, the positive terminals are connected together or the negative terminals are connected together. First, the result storage device R is set to "1". A pulse is applied to ensure that the current direction of R is negative. That is, when the negative terminals of A, B and R are connected, the positive terminals of A and B are connected to voltage V, and the positive terminal of R is grounded (see FIG. 4A); when the positive terminals of A, B and R are connected, the positive terminals of A and B are connected to voltage V, and the positive terminal of R is grounded. In this way, the result of the NAND logic operation of A and B is obtained in the resistive switching unit R (see FIG. 4B), which is expressed as R=$\overline{AB}$.

Multi-Input Logic Operation R'=$\overline{ABR}$

FIGS. 4A and 4B illustrate a method for implementing a NAND logic operation according to an embodiment of the disclosure. As shown in FIG. 4, the information stored in the first input resistive switching device, the second input resistive switching device, and the result storage device are A, B, and R, respectively. There are two cases of the three resistive switching units connected to the same bit line or word line as shown in the figure, that is, the positive terminals are connected together or the negative terminals are connected together. A pulse is applied to ensure that the current direction of R is negative. That is, when the negative terminals of A, B and R are connected, the positive terminals of A and B are connected to voltage V, and the positive terminal of R is grounded. When the positive terminals of A, B and R are connected, the positive terminals of A and B are connected to voltage V, and the positive terminal of R is grounded. In this way, the result R' of the logic operation of A "NAND" B and then "AND" R is obtained in the resistive switching unit R, which is expressed as R'=$\overline{AB}R$.

"COPY" Logic Operation

FIGS. 5A and 5B illustrate a method for implementing a "COPY" logic operation according to an embodiment of the present disclosure. As shown in FIG. 5A, the information stored in the first input resistive switching device and the result storage device are A and R, respectively. There are two cases of the two resistive switching units connected to the same bit line or word line, that is, the positive terminals are connected together or the negative terminals are connected together. Firstly, the result storage device R is set to "0". A pulse is then applied to ensure that the current direction of R is positive. That is, when the negative terminals of A and R are connected, the positive terminal of A is grounded, and the positive terminal of R is connected to voltage V. When the positive terminals of A and R are connected, the positive terminal of A is grounded, and the positive terminal of R is connected to voltage V. In this way, the result of the "COPY" logic operation of A is obtained in the resistive switching unit R, which is expressed as R=A.

Derived OR Logic Operation

FIGS. 5A and 5B illustrate a method for implementing a derived OR logic operation according to an embodiment of the present disclosure. As shown in FIG. 5A, the information stored in the first input resistive switching device and the result storage device are A and R, respectively. There are two cases of the two resistive switching units connected to the same bit line or word line, that is, the positive terminals are connected together or the negative terminals are connected together. A pulse is applied to ensure that the current direction of R is positive. That is, when the negative terminals of A and R are connected, the positive terminal of A is grounded, and the positive terminal of R is connected to voltage V. As shown in FIG. 5B, when the positive terminals of A and R are connected, the positive terminal of A is grounded, and the positive terminal of R is connected to voltage V. In this way, the result of the OR logic operation of A and R is obtained in the resistive switching unit R, which is expressed as R'=A+R. R' is the information stored in the resistive switching unit R after the operation, and the initial value of R will be overwritten.

"Full Addition" Operation

A full addition operation is a one-bit operation in a full adder, which takes into account the carry compared to a half addition operation. The input includes Ai, Bi, and the carry Ci−1 of the previous bit, and the output includes the sum Si of this bit and the resulting carry Ci. By rationally combining the above-mentioned basic logic operations and derived logic operations, only 6 resistive switching units and 7 steps of operation are required to implement the full addition function. The logic expression of the full adder is as follows:

$$Si = Ai \oplus Bi \oplus Ci-1 = \overline{Ai \oplus Bi Ci-1}(Ai \oplus Bi + Ci-1)$$

$$Ci = (Ai \oplus Bi)\ Ci-1 + AiBi$$

$$Ai \oplus Bi = \overline{Ai + Bi}(Ai + Bi)$$

As shown in FIG. 6, to implement the full addition logic, a total of 6 resistive switching units on the same word line or bit line are required. Two addends Ai and Bi and the carry Ci−1 of the previous bit are stored in three of the resistive switching units, respectively. The other three resistive switching units are used to store the results of the intermediate process and the final calculation results.

In the full addition operation, Ai and Bi are first subjected to an OR logic operation, and the result is Ai+Bi, which is stored in the resistive switching unit 1. In the second step, Ai, Bi, and Ai+Bi are subjected to a multi-input logic operation $\overline{AiBi}(Ai+Bi)$. The result is Ai⊕Bi, which is stored in the resistive switching unit 1 and the original stored data is overwritten. In the third step, Ai⊕Bi and Ci−1 are subjected to a NAND logic operation. The result $\overline{Ai \oplus Bi Ci-1}$ is stored in the resistive switching unit 2. In the fourth step, Ai⊕Bi and Ci−1 are subjected to an OR logic operation, and the result Ai⊕Bi+Ci−1 is stored in the resistive switching unit 3. In the fifth step, Ai⊕Bi, Ci−1 and Ai⊕Bi+Ci−1 are subjected to a multi-input logic operation. The result is $\overline{Ai \oplus Bi Ci-1}(Ai \oplus Bi + Ci-1)$=Si, which is stored in the resistive switching unit 3. In the sixth step, Ai and Bi are subjected to a NAND operation, and the result $\overline{AiBi}$ is stored in the resistive switching unit 2. In the seventh step, $\overline{Ai \oplus Bi Ci-1}$ and $\overline{AiBi}$ are subjected to a NAND operation. The result is Ci, which is stored in the original Ci−1 position.

According to an embodiment of the present disclosure, a method for implementing logical calculation based on a crossbar array memory structure of resistive switching devices is proposed. The calculation and storage functions are based on the same hardware architecture, and the data storage is completed at the same time as the calculation, thereby implementing the fusion of calculation and storage. The calculation result of each step is stored in the output unit, and the output unit is used as the input unit of the next calculation in the cascade, thereby avoiding the transmission and invoking of data, and effectively reducing the number of resistive switching devices and operation steps required to realize the calculation function.

Parallel Operation

The logic operation methods described in the present disclosure may be executed concurrently to realize parallel computing. Taking parallel computing of the "COPY" logic operation as an example, as shown in FIG. 7, the information stored in the first input resistive switching device and the first result storage device are A and R, respectively, and the information stored in the second input resistive switching device and the second result storage device are A' and R', respectively. Firstly, the result storage devices R and R' are set to "0". A pulse is then applied to ensure that the current direction of R' is positive. That is, the negative terminals of A and A' are connected to voltage V, and the negative terminals of R and R' are grounded. In this way, the result of the "COPY" logic operation of A is obtained in the resistive switching unit R, which is expressed as R=A, and at the same time, the result of the "COPY" logic operation of A' may be obtained in the resistive switching unit R', which is expressed as R'=A'. Various logic operations designed above and complex logic functions based on the basic logic operations may be performed in parallel in this way.

Partially Parallel Multi-Bit Full Adder

Figures 8, 9:
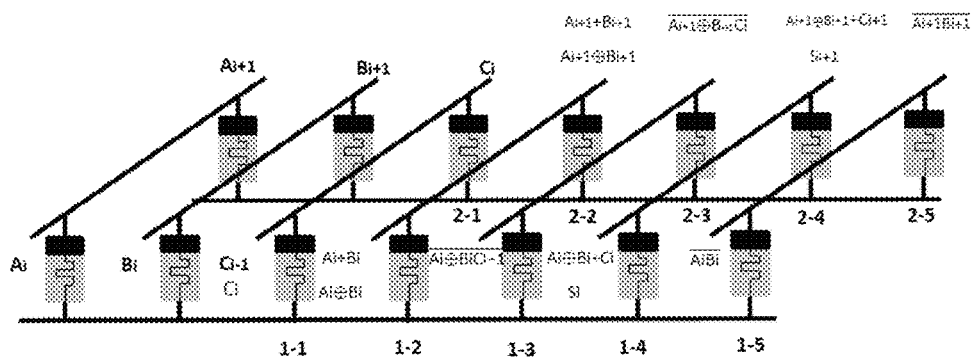
FIG. 8 is a schematic diagram of the operations of implementing the partially parallel full adder according to an embodiment of the present disclosure.
FIG. 9 is a schematic diagram of the combinations of eight types of Boolean operations according to an embodiment of the present disclosure.

Combining the parallel operation with the one-bit full adder implemented by the present disclosure may implement a partially parallel multi-bit full adder. As shown in FIG. 8, implementing a two-bit full addition logic requires a total of two sets of 6 resistive switching units on the same word line or bit line. The two addends Ai and Bi and the two higher addends Ai+1 and Bi+1 (one bit higher) are aligned by the COPY logic. Ci−1 is the carry from the previous bit. Other resistive switching units are used to store the results of the intermediate process and the final calculation results.

In the full addition operation, Ai and Bi are firstly subjected to an OR operation. The positive terminals of Ai and Bi are grounded, and the negative terminals are connected to VOR. The result is Ai+Bi, which is stored in the resistive switching unit 1-1. According to the circuit analysis result, Ai+1 and Bi+1 are also subjected to an OR operation under this excitation, and the result Ai+1+Bi+1 is stored in the resistive switching unit 2-1. In the second step, Ai, Bi, and Ai+Bi are subjected to a multi-input logic operation $\overline{AiBi}$ (Ai+Bi). The result is Ai⊕Bi, which is stored in the resistive switching unit 1-1 and the original stored data is overwritten. Similarly, Ai+1⊕Bi+1 is also obtained at the same time and saved in 2-1. In the third step, the word line or bit line connected to Ai+1 and Bi+1 is connected to ½VNAND, and then Ai⊕Bi and Ci−1 are subjected to a NAND logic operation. The result $\overline{Ai⊕BiCi-1}$ is stored in the resistive switching unit 1-3. In the fourth step, the word line or bit line connected to Ai+1 and Bi+1 is connected to ½VOR, and then Ai⊕Bi and Ci−1 are subjected to an OR logic operation. The result Ai⊕Bi+Ci−1 is stored in the resistive switching unit 1-4. In the fifth step, Ai and Bi, Ai+1 and Bi+1 are subjected to a NAND operation. The result $\overline{AiBi}$ is stored in the resistive switching unit 1-5, and the result $\overline{Ai+1Bi+1}$ is stored in the resistive switching unit 2-5. In the sixth step, the word line or bit line connected to Ai+1 and Bi+1 is connected to ½VNAND, and $\overline{Ai⊕BiCi-1}$ and $\overline{AiBi}$ are subjected to a NAND operation. The result is Ci, which is stored in the original Ci−1 position. In the seventh step, Ci is moved to 2-1 through the COPY logic. In the eighth step, the word line or bit line connected to Ai and Bi is connected to ½VNAND, and then Ai+1⊕Bi+1 and Ci are subjected to a NAND logic operation. The result $\overline{Ai+1⊕Bi+1Ci}$ is stored in the resistive switching unit 2-3. In the ninth step, the word line or bit line connected to Ai and Bi is connected to ½VOR, and then Ai+1⊕Bi+1 and Ci are subjected to an OR logic operation. The result Ai+1⊕Bi+1+Ci is stored in the resistive switching unit 2-4. In the tenth step, the word line or bit line connected to Ai and Bi is connected to ½VNAND, $\overline{Ai+1⊕Bi+1Ci}$ and $\overline{Ai+1Bi+1}$ are subjected to a NAND operation. The result is Ci+1, which is stored in the original Ci position. In the eleventh step, Ai⊕Bi, Ci−1, Ai⊕Bi+Ci−1, Ai+1⊕Bi+1, Ci, and Ai+1⊕Bi+1+Ci are subjected to a multi-input logic operation, and the results are Si and Si+1 respectively, which are stored in the resistive switching units 1-4 and 2-4.

Each multi-bit full adder may be simplified according to this method. A n-bit full adder needs 3+4n steps to complete the operation.

To make the objectives, technical solutions, and advantages of the present disclosure clearer, the present disclosure will be further described below in detail, with conjunction of the specific embodiments and the reference to the accompanying drawings.

FIG. 9 is a schematic diagram of combinations of eight types of Boolean operations according to an embodiment of the disclosure. FIG. 10 is a schematic diagram of combinations of other eight types of Boolean operations according to an embodiment of the disclosure. As shown in FIG. 9 and FIG. 10, by combining the logical operation methods in the above embodiments, any of 16 types of Boolean logic calculations may be implemented in a maximum of three steps.

The above embodiment realizes the integration of logic calculation and data storage, and the problems of the logic calculation based on the resistive switching devices (that is, a large number of resistive switching units are required, and the operation steps are complicated and verbose) are solved. The present disclosure proposes a method for implementing the integration of calculation and storage based on the crossbar structure of resistive switching devices. By designing the positions where pulse sequences are applied in the cross point array, the resistive switching units form different serial-parallel structures, such that three basic logic operations, i.e. NAND, OR, and COPY, are implemented and mutually combined on this basis, thereby implementing 16 types of basic Boolean logic. The number of resistive switching units and operation steps required for logic operations are effectively reduced.

The specific embodiments described above further illustrate the purpose, technical solutions and beneficial effects of the present disclosure. It should be understood that the above description is only specific embodiments of the present disclosure and is not used to limit the present disclosure. Any modification, equivalent replacement, and improvement made within the spirit and principle of the present disclosure shall fall within the protection scope of the present disclosure.

What is claimed:

1. A method for implementing logic calculation based on a crossbar array structure of resistive switching devices, the method comprising:

selecting a set of two or three resistive switching units sharing a word line or bit line;

using one resistive switching unit of the set of resistive switching units as an output resistive switching unit, and using the remaining one or more resistive switching units of the set of resistive switching units as input resistive switching unit(s); and not applying a voltage to a terminal of each resistive switching unit of the set of resistive switching units at which the word line or bit line is shared, connecting a non-shared terminal of the output resistive switching unit to a high or low level, and connecting a non-shared terminal of each of the one or more input resistive switching units to a level opposite to the non-shared terminal of the output resistive switching unit, to enable information of each input resistive switching unit to be stored in the output resistive switching unit while a logic operation is performed at the same time, wherein the input resistive switching unit(s) comprise a first input resistive switching unit and a second input resistive switching unit, data stored in the first input resistive switching unit and the second input resistive switching unit are "A" and "B", respectively, and the first input resistive switching unit and the second input resistive switching unit are connected to a same word line or bit line, and the initial data stored in the output resistive switching unit connected to the word line or bit line is "C"; there are two cases of the three resistive switching units connected to the same bit line or word line, that is, the positive terminals are connected together or the negative terminals are connected together, if the positive terminals are connected together, a voltage $V_{OR}$ is applied, through a word line or a bit line, to two terminals of the first input resistive switching unit and the second input resistive switching unit that are not interconnected, and the other terminal of the output resistive switching unit, which is not connected to the first input resistive switching unit and the second input resistive switching unit, is grounded, if the negative terminals are connected together, connecting to the voltage $V_{OR}$ and grounding are performed in an opposite way; a final result is stored in the output resistive switching unit, and the value R of the final result in the output resistive switching unit is a result of an OR operation of A, B and C, which is expressed as R=A+B+C.

2. The method according to claim 1, wherein:
the output resistive switching unit is initially set to "1", the first input resistive switching unit, the second input resistive switching unit and the output resistive switching unit share a word line or bit line at a terminal, and no level is applied to the word line or bit line; the other terminal of each of the first input resistive switching unit and the second input resistive switching unit is connected to a high or low level, the other terminal of the output resistive switching unit is connected to a level opposite to the other terminal of each of the first input resistive switching unit and the second input resistive switching unit, and a current direction of the output resistive switching unit is ensured to be negative to implement a NAND logic, that is, if data stored in the first input resistive switching unit is A and data stored in the second input resistive switching unit is B, then data stored in the output resistive switching unit after implementing the NAND logic is R=$\overline{AB}$.

3. The method according to claim 1, wherein:
the output resistive switching unit is initially set to "0", the first input resistive switching unit and the output resistive switching unit share a word line or bit line at a terminal, and no level is applied to the word line or bit line; the other terminal of the first input resistive switching unit is connected to a high or low level, the other terminal of the output resistive switching unit is connected to a level opposite to the other terminal of the first input resistive switching unit; and a current direction of the output resistive switching unit is guaranteed to be positive to implement a COPY logic, that is, if data stored in the first input resistive switching unit is A, then data stored in the output resistive switching unit is R=A after implementing the COPY logic.

4. The method according to claim 1, wherein: the output resistive switching unit has a positive terminal grounded and a negative terminal connected to a voltage, and is initialized to "0" in advance; positive or negative terminals of the first input resistive switching unit, the second input resistive switching unit and the output resistive switching unit are connected; when the positive terminals of the first input resistive switching unit, the second input resistive switching unit and the output resistive switching unit are connected, the negative terminals of the first input resistive switching unit and the second input resistive switching unit are connected to a voltage, and the negative terminal of the output resistive switching unit is grounded; or when the negative terminals of the first input resistive switching unit, the second input resistive switching unit and the output resistive switching unit are connected, the positive terminals of the first input resistive switching unit and the second input resistive switching unit are grounded, and the positive terminal of the output resistive switching unit is connected to a voltage; a pulse is applied to ensure that a current direction of the output resistive switching unit is positive to implement an OR operation, and a result of the operation, which is expressed as R=A+B, is stored in the output resistive switching unit.

5. The method according to claim 1, wherein:
there are two cases of the three resistive switching units connected to the same bit line or word line, that is, the positive terminals are connected together or the negative terminals are connected together, if the positive terminals are connected together, two terminals of the first input resistive switching unit and the second input resistive switching unit, which are not connected are grounded through a word line or a bit line, and a voltage $V_{NAND}$ is applied to the other terminal of the output resistive switching unit, which is not connected to the first input resistive switching unit and the second input resistive switching unit, if the negative terminals are connected together, connecting to the voltage $V_{NAND}$ and grounding are performed in an opposite way; a final result is stored in the output resistive switching unit, and a result value R of the output resistive switching unit results from an "AND" operation of C and a result of a "NAND" operation of A and B, which is expressed as R=$\overline{AB}$C.

6. The method according to claim 1, wherein:
there are two cases of the two resistive switching units connected to the same bit line or word line, that is, the positive terminals are connected together or the negative terminals are connected together, if the positive terminals are connected together, a voltage $V_{COPY}$ is applied, through a word line or a bit line, to the other terminal of the first input resistive switching unit that is not interconnected, and the other terminal of the output resistive switching unit, which is not connected to the first input resistive switching unit, is grounded, if the negative terminals are connected together, connecting to the voltage $V_{COPY}$ and grounding are performed in an opposite way; a final result is stored in the output resistive switching unit, and the result value R of the output resistive switching unit is a result of an OR operation of A and C, which is expressed as R=A+C.

7. A system comprising:
a crossbar array structure of resistive switching devices, wherein a set of two or three resistive switching units sharing a word line or bit line are selected and one resistive switching unit of the set of resistive switching units is used as an output resistive switching unit, and the one or more remaining resistive switching units of the set of resistive switching units are as input resistive switching unit(s); and
a controller configured to connect a non-shared terminal of the output resistive switching unit to a high or low level, and connect a non-shared terminal of each of the one or more input resistive switching units to a level opposite to the non-shared terminal of the output resistive switching unit, to enable information of each input resistive switching unit to be stored in the output resistive switching unit while a logic operation is performed at the same time, wherein a voltage is not applied to a terminal of each resistive switching unit of the set of resistive switching units at which the word line or bit line is shared,
wherein the input resistive switching unit(s) comprise a first input resistive switching unit and a second input resistive switching unit,
the first input resistive switching unit and the second input resistive switching unit are connected to a same word line or bit line, and
the control system is configured to:
if the three resistive switching units are connected to the same bit line or word line and the positive terminals are connected together, apply a voltage $V_{OR}$ through a word line or a bit line to two terminals of the first input resistive switching unit and the second input resistive switching unit that are not interconnected, and ground the other terminal of the output resistive switching unit, which is not connected to the first input resistive switching unit and the second input resistive switching unit, or if the three resistive switching units are connected to the same bit line or word line and the negative terminals are connected together, perform the connecting the voltage $V_{OR}$ and grounding in an opposite way to the above situation where the positive terminals are connected together, wherein a final result is stored in the output resistive switching unit and the value R of the final result in the output resistive switching unit is a result of an OR operation of A, B and C, which is expressed as R=A+B+C, wherein initial data stored in the output resistive switching unit connected to the word line or bit line is "C" and data stored in the first input resistive switching unit and the second input resistive switching unit are "A" and "B", respectively.

8. The system of claim 7, wherein:

the first input resistive switching unit, the second input resistive switching unit and the output resistive switching unit share a word line or bit line at a terminal, and the control system is configured to:
set the output resistive switching unit initially to "1", wherein no level is applied to the word line or bit line,
connect the other terminal of each of the first input resistive switching unit and the second input resistive switching unit to a high or low level,
connect the other terminal of the output resistive switching unit to a level opposite to the other terminal of each of the first input resistive switching unit and the second input resistive switching unit, and
ensure a current direction of the output resistive switching unit to be negative to implement a NAND logic, that is, if data stored in the first input resistive switching unit is A and data stored in the second input resistive switching unit is B, then data stored in the output resistive switching unit after implementing the NAND logic is R=$\overline{AB}$.

9. The system of claim 7, wherein:

the first input resistive switching unit and the output resistive switching unit share a word line or bit line at a terminal, and the control system is configured to:
set the output resistive switching unit initially to "0", wherein no level is applied to the word line or bit line,
connect the other terminal of the first input resistive switching unit to a high or low level,
connect the other terminal of the output resistive switching unit to a level opposite to the other terminal of the first input resistive switching unit, and
ensure a current direction of the output resistive switching unit to be positive to implement a COPY logic, that is, if data stored in the first input resistive switching unit is A, then data stored in the output resistive switching unit is R=A after implementing the COPY logic.

10. The system of claim 7, wherein:

the output resistive switching unit has a positive terminal grounded and a negative terminal connected to a voltage, positive or negative terminals of the first input resistive switching unit, the second input resistive switching unit and the output resistive switching unit are connected, and the control system is configured to:
initialize the output resistive switching unit to "0" in advance,
when the positive terminals of the first input resistive switching unit, the second input resistive switching unit and the output resistive switching unit are connected, connect the negative terminals of the first input resistive switching unit and the second input resistive switching unit to a voltage, and ground the negative terminal of the output resistive switching unit, or when the negative terminals of the first input resistive switching unit, the second input resistive switching unit and the output resistive switching unit are connected, ground the positive terminals of the first input resistive switching unit and the second input resistive switching unit, and connect the positive terminal of the output resistive switching unit to a voltage,
apply a pulse to ensure that a current direction of the output resistive switching unit is positive to implement an OR operation, and a result of the operation, which is expressed as R=A+B, is stored in the output resistive switching unit.

11. The system of claim 7, wherein the control system is configured it:

if the three resistive switching units are connected to the same bit line or word line and the positive terminals are connected together, ground two terminals of the first input resistive switching unit and the second input resistive switching unit, which are not connected, through a word line or a bit line, and apply a voltage $V_{NAND}$ to the other terminal of the output resistive switching unit, which is not connected to the first input resistive switching unit and the second input resistive switching unit, or if the three resistive switching units are connected to the same bit line or word line and the negative terminals are connected together, perform the connecting the voltage $V_{NAND}$ and grounding in an opposite way to the above situation where the positive terminals are connected together, wherein a final result is stored in the output resistive switching unit and a result value R of the output resistive switching unit results from an "AND" operation of C and a result of a "NAND" operation of A and B, which is expressed as R=$\overline{AB}$C.

12. The system of claim 7, wherein and the control system is configured to:

if the two resistive switching units are connected to the same bit line or word line and the positive terminals are connected together, apply a voltage $V_{COPY}$, through a word line or a bit line, to the other terminal of the first input resistive switching unit that is not interconnected, and ground the other terminal of the output resistive switching unit, which is not connected to the first input resistive switching unit, or if the two resistive switching units are connected to the same bit line or word line and the negative terminals are connected together, perform the connecting the voltage $V_{COPY}$ and grounding in an opposite way to the above situation where the positive terminals are connected together, wherein a final result is stored in the output resistive switching unit and the result value R of the output resistive switching unit is a result of an OR operation of A and C, which is expressed as R=A+C.

13. The system of claim 7, configured to implement 16 types of binary Boolean logic operations.

14. A computer system comprising the system of claim 7.

15. The method of claim 1, comprising performing 16 types of binary Boolean logic operations using the crossbar array structure of resistive switching devices.

* * * * *